United States Patent
Huang

(10) Patent No.: US 10,090,354 B2
(45) Date of Patent: Oct. 2, 2018

(54) LIGHT SENSING UNIT AND LIGHT SENSING CIRCUIT FOR IMAGE SENSOR WITH LIGHT SENSING CARRIERS TRANSFERRED BETWEEN DIFFERENT FLOATING NODES

(71) Applicant: NOVATEK Microelectronics Corp., Hsin-Chu (TW)

(72) Inventor: Dong-Hai Huang, Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 213 days.

(21) Appl. No.: 14/702,767

(22) Filed: May 4, 2015

(65) Prior Publication Data
US 2016/0233265 A1  Aug. 11, 2016

(30) Foreign Application Priority Data
Feb. 10, 2015  (TW) .............................. 104104445 A

(51) Int. Cl.
*H01L 27/146* (2006.01)
*G01J 1/42* (2006.01)

(52) U.S. Cl.
CPC ...... *H01L 27/14641* (2013.01); *G01J 1/4204* (2013.01); *H01L 27/14609* (2013.01); *H01L 27/14643* (2013.01)

(58) Field of Classification Search
CPC ......... H01L 27/14641; H01L 27/14609; H01L 27/14643; H01L 27/14638; H01L 27/14601; G01J 1/4204

USPC .... 250/214.1, 214 R, 208.1, 214 A, 214 AL; 257/290, 291, 292, 258, 257; 348/308, 348/302, 294, 296

See application file for complete search history.

(56) References Cited

U.S. PATENT DOCUMENTS

| | | | |
|---|---|---|---|
| 6,980,244 B1 * | 12/2005 | Yonemoto | ............ H04N 5/3532 348/302 |
| 7,705,900 B2 * | 4/2010 | Guidash | ............ H01L 27/14643 250/208.1 |
| 8,786,745 B2 | 7/2014 | Kawahito | |
| 2006/0186504 A1 | 8/2006 | Bae | |
| 2006/0255380 A1 | 11/2006 | Lee | |

(Continued)

FOREIGN PATENT DOCUMENTS

| CN | 1984230 A | 6/2007 |
|---|---|---|
| CN | 101213829 A | 7/2008 |

(Continued)

*Primary Examiner* — Que T Le
*Assistant Examiner* — Jennifer Bennett
(74) *Attorney, Agent, or Firm* — Winston Hsu

(57) ABSTRACT

A light sensing unit for a light sensing circuit of an image sensor includes a first light sensing element, a first floating node and at least one coupling element. The first light sensing element is used for sensing light to obtain a light sensing result and generating a plurality of carriers accordingly. The first floating node is used for receiving and storing the plurality of carriers generated by the first light sensing element. The at least one coupling element is used for coupling the first floating node to at least one second floating node, and transmitting a part of the plurality of carriers stored in the first floating node to the at least one second floating node to be stored in the at least one second floating node.

22 Claims, 14 Drawing Sheets

(56) References Cited

U.S. PATENT DOCUMENTS

| | | | | |
|---|---|---|---|---|
| 2007/0285545 | A1* | 12/2007 | Hsieh | H01L 27/14634 |
| | | | | 348/294 |
| 2010/0182465 | A1* | 7/2010 | Okita | H04N 5/343 |
| | | | | 348/273 |
| 2010/0225795 | A1* | 9/2010 | Suzuki | H01L 27/14609 |
| | | | | 348/300 |
| 2013/0248939 | A1* | 9/2013 | Sakai | H01L 27/14806 |
| | | | | 257/231 |
| 2014/0078368 | A1* | 3/2014 | Komori | H04N 5/3745 |
| | | | | 348/307 |

FOREIGN PATENT DOCUMENTS

| | | |
|---|---|---|
| CN | 101902585 A | 12/2010 |
| TW | 200808047 A | 2/2008 |
| TW | I333325 | 11/2010 |
| TW | 201334525 A1 | 8/2013 |

\* cited by examiner

LIGHT SENSING UNIT AND LIGHT SENSING CIRCUIT FOR IMAGE SENSOR WITH LIGHT SENSING CARRIERS TRANSFERRED BETWEEN DIFFERENT FLOATING NODES

BACKGROUND OF THE INVENTION

1. Field of the Invention

The present invention relates to a light sensing unit and a related light sensing circuit, and more particularly, to a light sensing unit and a related light sensing circuit capable of realizing high signal-to-noise ratio, high light sensitivity and high dynamic range in an image sensor.

2. Description of the Prior Art

An image sensor, as a device capable of converting an optical image into an electronic signal, is widely applied in various electronic products such as digital cameras, medical image products, monitoring equipment and video telephones. Currently available image sensors are divided into charge coupled device (CCD) image sensors and complementary metal oxide semiconductor (CMOS) image sensors. With advances in integrated circuit process technology, the CMOS image sensor has become more popular than the CCD image sensor in the image sensor market.

The CMOS image sensors are further divided into passive pixel sensors (PPS) and active pixel sensors (APS) according to the circuit structure of pixels. The difference is that in the APS, the signals transmitted to back-end circuits pass through an active element in advance. The APS may have different structures due to transistor counts, such as 3T structure (with 3 transistors) or 4T structure (with 4 transistors). In a CMOS image sensor, image sensing is performed in the following manners: a light sensing element in each pixel performs light sensing; the light sensing element then generates carriers corresponding to sensed light intensity and transmits the carriers to a floating node; and the back-end circuit reads out the number of carriers in the floating node to obtain a light sensing result.

"Dynamic range" is the maximal bottleneck in development of modern CMOS image sensors. People eye can always be adaptive to a dynamic range up to more than 200 dB, but most available CMOS image sensors cannot achieve this requirement; hence, most of image sensor manufacturers are striving to enhance the dynamic range of image sensors. A common method of enhancing dynamic range is to perform multiple exposures, but this method cannot achieve high signal-to-noise ratio (SNR) and high light sensitivity simultaneously since the carrier transmission efficiency in the light sensing elements and the readable signal range of the output circuit are limited. Another method of enhancing dynamic range is to enlarge the floating node capacitors. Although this method may achieve high SNR, the increasing of dynamic range is accompanied by a tradeoff of decreasing light sensing area; that is, a large amount of light sensing area is sacrificed due to the requirement of high dynamic range, such that high light sensitivity cannot be achieved at the same time. Thus, there is a need to provide an image sensor capable of high dynamic range, high light sensitivity and high SNR simultaneously.

SUMMARY OF THE INVENTION

It is therefore an objective of the present invention to provide a light sensing unit and a related light sensing circuit for an image sensor, so that image sensor is characterized by high dynamic range, high light sensitivity and high signal-to-noise ratio (SNR).

The present invention discloses a light sensing unit for a light sensing circuit of an image sensor. The light sensing unit comprises a first light sensing element, a first floating node and at least one coupling element. The first light sensing element is used for sensing light to obtain a light sensing result and generating a plurality of carriers accordingly. The first floating node is used for receiving and storing the plurality of carriers generated by the first light sensing element. The at least one coupling element is used for coupling the first floating node to at least one second floating node, and transmitting a part of the plurality of carriers stored in the first floating node to the at least one second floating node to be stored in the at least one second floating node.

The present invention further discloses a light sensing circuit for an image sensor. The light sensing circuit comprises a first light sensing element, a first floating node, a transfer switch, at least one coupling element, a reset switch and an output unit. The first light sensing element is used for sensing light to obtain a light sensing result and generating a plurality of carriers accordingly. The first floating node is used for receiving and storing the plurality of carriers generated by the first light sensing element. The transfer switch, coupled between the first light sensing element and the first floating node, is used for transmitting the plurality of carriers generated by the first light sensing element to the first floating node when turned on. The at least one coupling element is used for coupling the first floating node to at least one second floating node, and transmitting a part of the plurality of carriers stored in the first floating node to the at least one second floating node to be stored in the at least one second floating node. The reset switch, coupled to the first floating node, is used for eliminating the plurality of carriers in the first floating node and the at least one second floating node when turned on. The output unit comprises a select switch and an output element. The select switch, controlled by an output circuit of the image sensor, is used for selecting to receive the light sensing result when turned on. The output element is used for converting the plurality of carriers stored in the first floating node and the at least one second floating node into an electronic signal, and transmitting the electronic signal to the output circuit when the select switch is turned on, allowing the output circuit to read out the light sensing result from the electronic signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
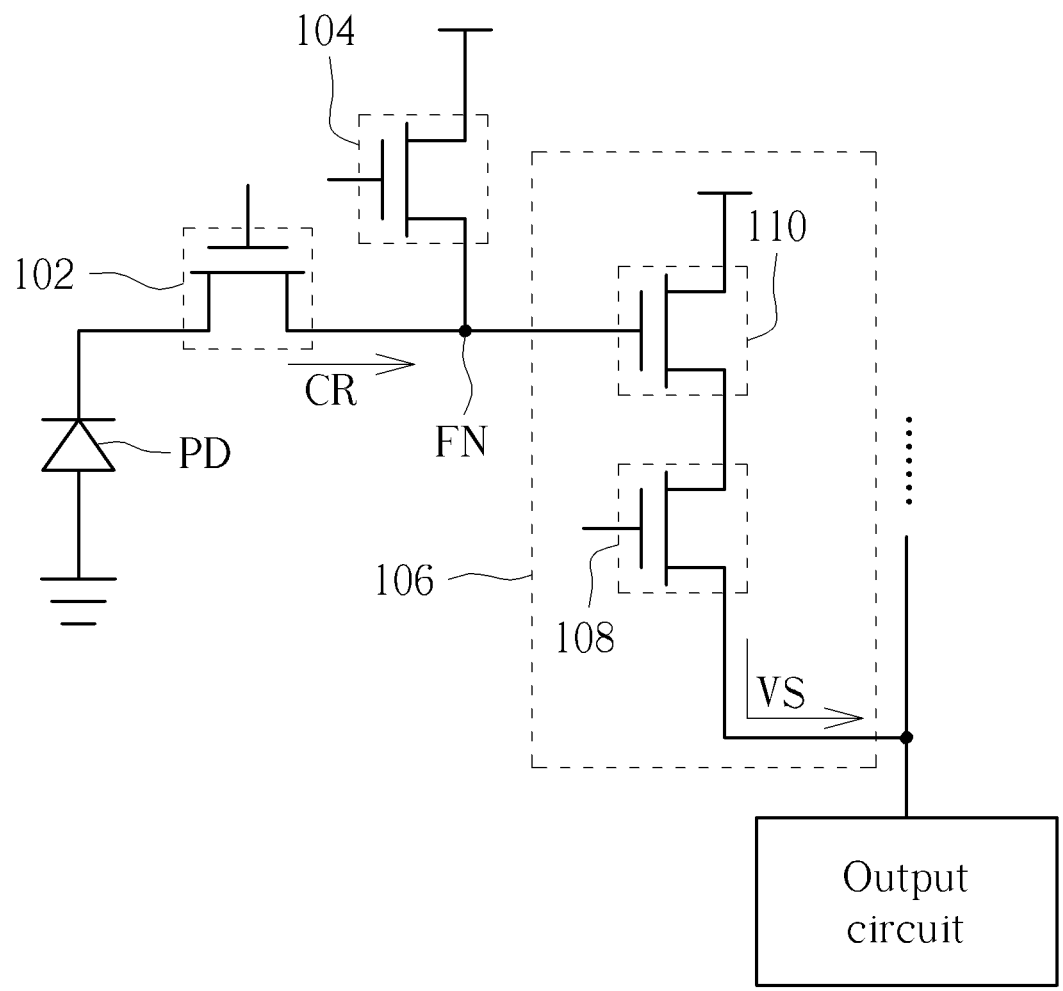
FIG. 1A and FIG. 1B are schematic diagrams of a light sensing circuit of a 4T complementary metal oxide semiconductor (CMOS) image sensor.
Figure 1B:
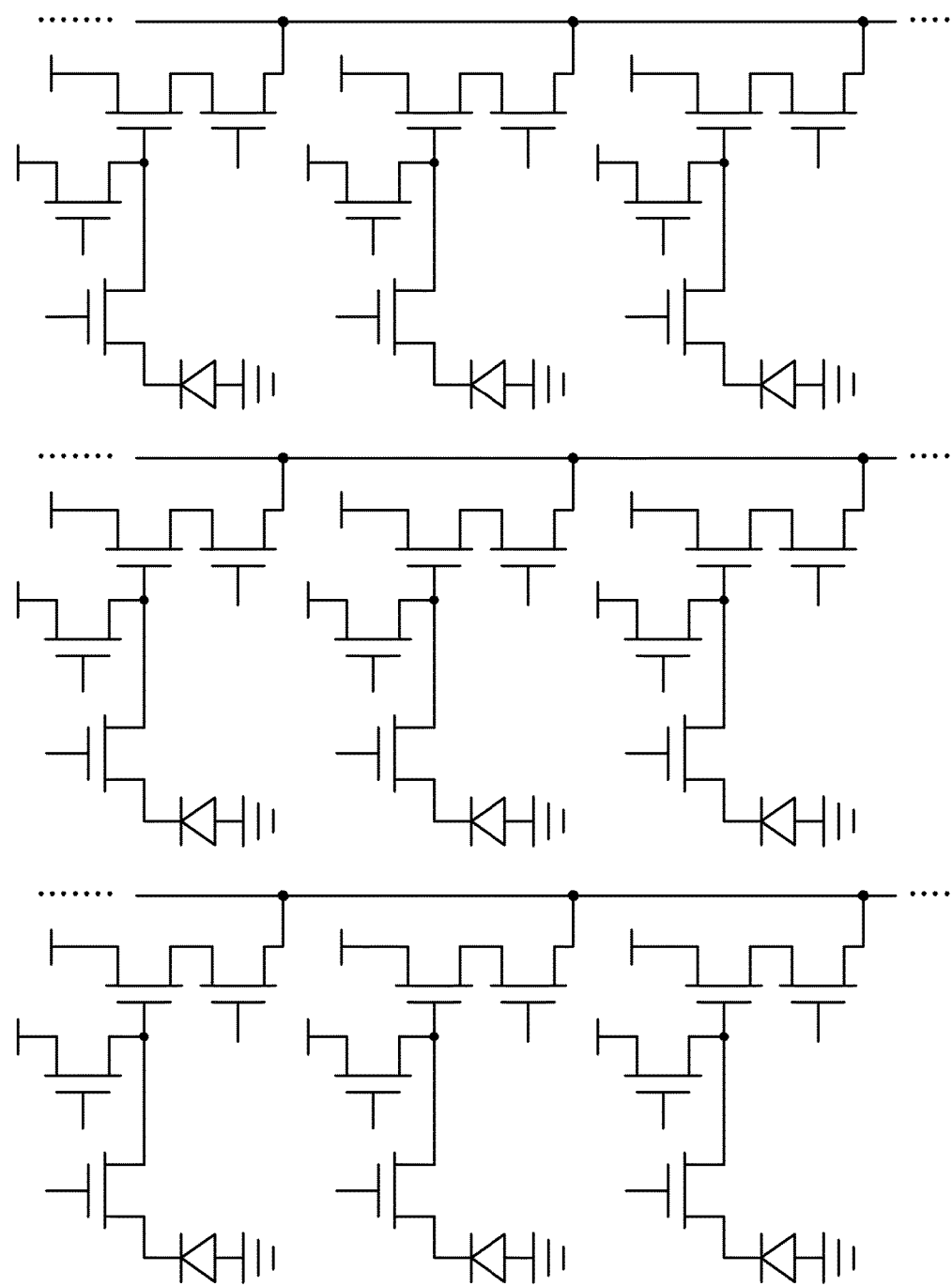

Please refer to FIG. 1A and FIG. 1B, which are schematic diagrams of a light sensing circuit of a 4T complementary metal oxide semiconductor (CMOS) image sensor, wherein FIG. 1A illustrates the light sensing circuit structure of a single pixel, and FIG. 1B illustrates the structure of multiple light sensing circuits arranged in the image sensor. As shown in FIG. 1A, a light sensing circuit corresponding to a pixel in the image sensor includes a light sensing element PD, a floating node FN, a transfer switch 102, a reset switch 104 and an output unit 106. The light sensing element PD, which can be a photodiode or other element having photovoltaic conversion functionality, is used for sensing light to obtain a light sensing result and generating a plurality of carriers CR accordingly. The floating node FN is used for receiving the carriers CR generated by the light sensing element PD, and has a capacitor for storing the carriers CR. The transfer switch 102 is coupled between the light sensing element PD and the floating node FN. When the transfer switch 102 is turned on, the carriers CR generated by the light sensing element PD are transmitted to the floating node FN. The reset switch 104, coupled to the floating node FN, can eliminate the carriers CR in the floating node FN when the reset switch 104 is turned on. The output unit 106 includes a select switch 108 and an output element 110. The select switch 108 is controlled by an output circuit of the image sensor; that is, the output circuit turns on the select switch 108 of a light sensing circuit, to select to receive the light sensing result corresponding to the pixel of the light sensing circuit. The method of receiving the light sensing result is performed by interpreting the signals in the output element 110; that is, the output element 110 converts the number of the carriers CR stored in the floating node FN into an electronic signal VS. When the select switch 108 is turned on, the output element 110 then transmits the electronic signal VS to the output circuit of the image sensor. This allows the output circuit to readout the light sensing result from the electronic signal VS.

In FIG. 1B, the light sensing circuits corresponding to multiple pixels in the image sensor are arranged in an array. Please note that FIG. 1B only illustrates an arrangement method, and the number of light sensing circuits actually arranged in the image sensor is far greater than those shown in FIG. 1B, such as three millions, five millions or more than several tens of millions. The output units of each column of light sensing circuits are coupled to the same output terminal, and a control signal in turn controls the select switches in each row of light sensing circuits to be turned on, to in turn obtain the light sensing results in the corresponding pixels.

Figure 2A:
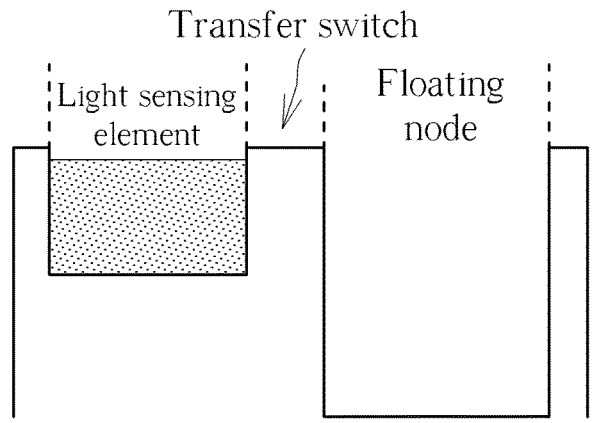
FIG. 2A, FIG. 2B and FIG. 2C are schematic diagrams of carrier transfers in the CMOS image sensor shown in FIG. 1A.
Figure 2B:
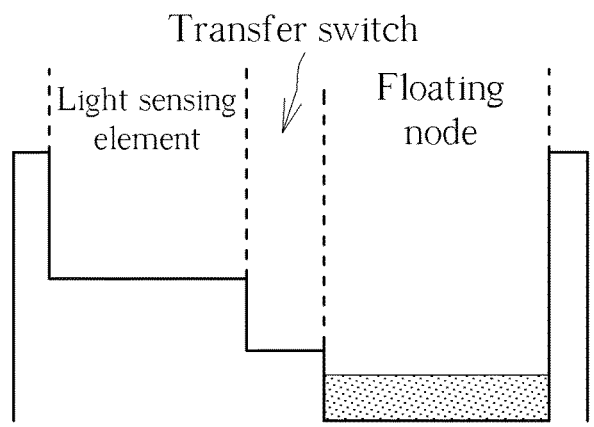
Figure 2C:
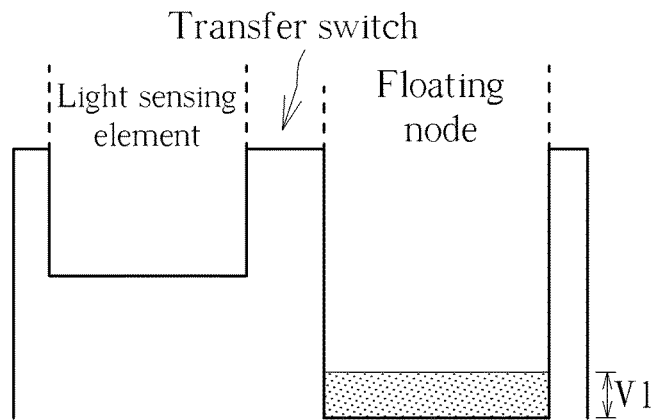

Please refer to FIG. 2A, FIG. 2B and FIG. 2C, which are schematic diagrams of carrier CR transfers in the CMOS image sensor shown in FIG. 1A. FIG. 2A, FIG. 2B and FIG. 2C illustrate the situation of carrier transfers where the capacitance value of the floating node FN is larger. In general, the carriers CR move from a position with higher potential energy to another position with lower potential energy when transferring. As shown in FIG. 2A, the light sensing element PD performs light sensing to generate the carriers CR, where the transfer switch 102 is turned off so that the carriers CR are stored in the light sensing element PD. Then, as shown in FIG. 2B, the transfer switch 102 is turned on to transmit the carriers CR to the floating node FN with a lower potential energy. Since the floating node FN has a larger capacitance, all of the carriers CR in the light sensing element PD can be transferred to the floating node FN. Then, as shown in FIG. 2C, when the transfer switch 102 is turned off, the output circuit is used to read out a voltage signal V1 on the floating node FN. In such a condition, since the capacitance of the floating node FN is larger, the obtained voltage signal V1 converted from the carriers CR is smaller. Therefore, when exposure amount of the light sensing element PD is less, the voltage signal V1 becomes smaller, which requires an extra gain in the back-end circuits. Accordingly, the voltage signal V1 is easily incorporated with extra noises, such that the signal-to-noise ratio (SNR) is reduced. In addition, in order to dispose a larger capacitor in the floating node FN, the layout area or the parasitic capacitance on the backend metal may be increased. Both of the solutions sacrifice light sensing area of the light sensing element PD, and therefore degrade light sensitivity.

Figure 3A:
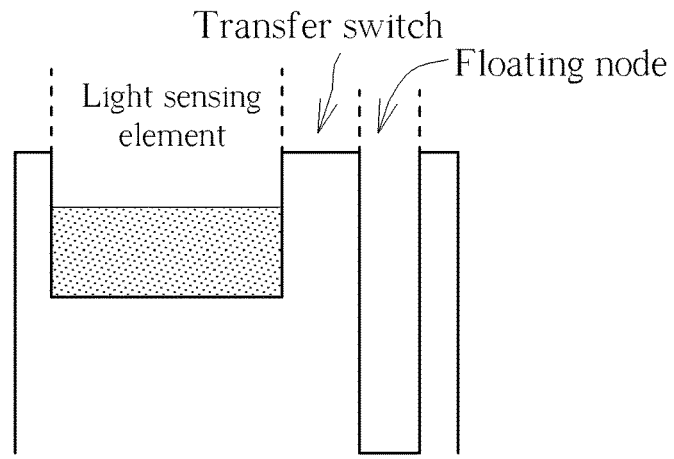
FIG. 3A, FIG. 3B and FIG. 3C are schematic diagrams of carrier transfers in the CMOS image sensor shown in FIG. 1A.
Figure 3B:
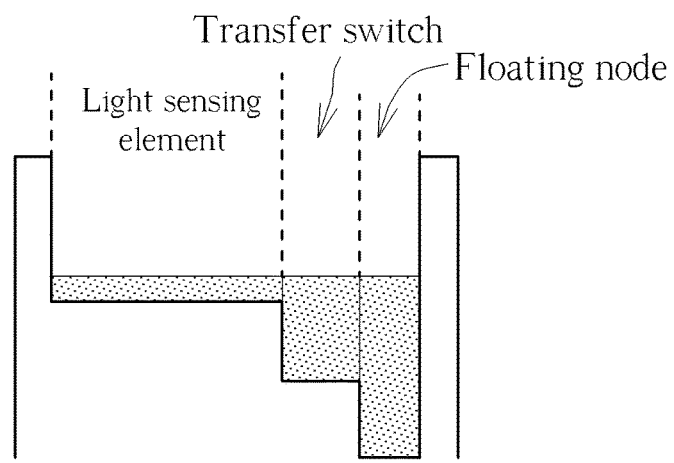
Figure 3C:
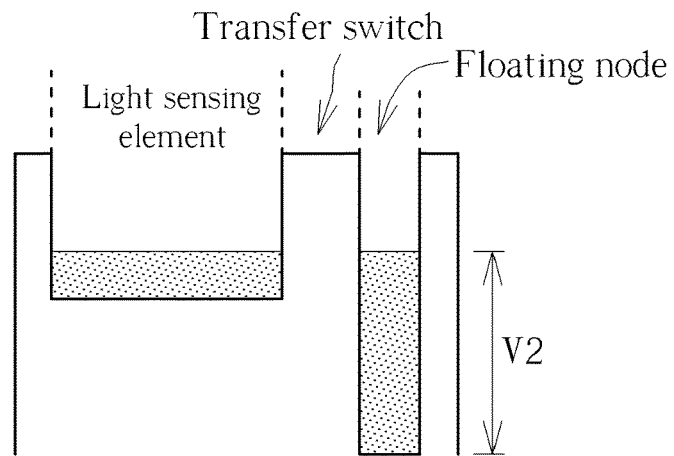

Please refer to FIG. 3A, FIG. 3B and FIG. 3C, which are schematic diagrams of carrier CR transfers in the CMOS image sensor shown in FIG. 1A. FIG. 3A, FIG. 3B and FIG. 3C illustrate the situation of carrier transfers where the capacitance value of the floating node FN is smaller. As shown in FIG. 3A, the light sensing element PD performs light sensing to generate the carriers CR, where the transfer switch 102 is turned off so that the carriers CR are stored in the light sensing element PD. Then, as shown in FIG. 3B, the transfer switch 102 is turned on to transmit the carriers CR to the floating node FN with a lower potential energy. Since the floating node FN has a small capacitance, the carriers CR in the light sensing element PD may not be entirely transferred to the floating node FN. Then, as shown in FIG. 3C, when the transfer switch 102 is turned off, the output terminal reads out a voltage signal V2 on the floating node FN. In such a condition, since the capacitance of the floating node FN is smaller, the carriers CR transmitted to the floating node FN induce a larger voltage signal V2. However, the carriers CR in the light sensing element PD may not be entirely transmitted to the floating node FN, such that the maximum SNR and dynamic range are limited by the capacitance value of the floating node FN. The maximum SNR is the SNR in the condition where the carriers stored in the floating node FN reach a maximum quantity, and its optimal value is equal to $20 \times \log(m/n)$, wherein m denotes the maximum number of carriers stored in the floating node FN and n denotes the noise value. The optimal value of the dynamic range is equal to $20 \times \log(m/p)$, wherein m denotes the maximum number of carriers stored in the floating node FN and p denotes the read-out noise value in a dark environment. In such a situation, the maximum SNR and dynamic range do not increase even with increasing of the carriers stored in the light sensing element PD.

In order to improve the abovementioned problem, the prior art usually applies an external capacitor added on the floating node, and a switch is incorporated to adjust the capacitance value. However, each pixel in the image sensor requires a large amount of capacitance, which occupies extremely large area when each floating node is connected to an external capacitor. On the other hand, enhancement of the dynamic range is usually realized by performing multiple exposures in the prior art. However, even if the implementations of multiple exposures increase the number of carriers read in the light sensing element, the number of carriers transmitted to the floating node is still limited by the capacitance value in the floating node, such that the maximum SNR and dynamic range are not improved effectively.

Figure 4:
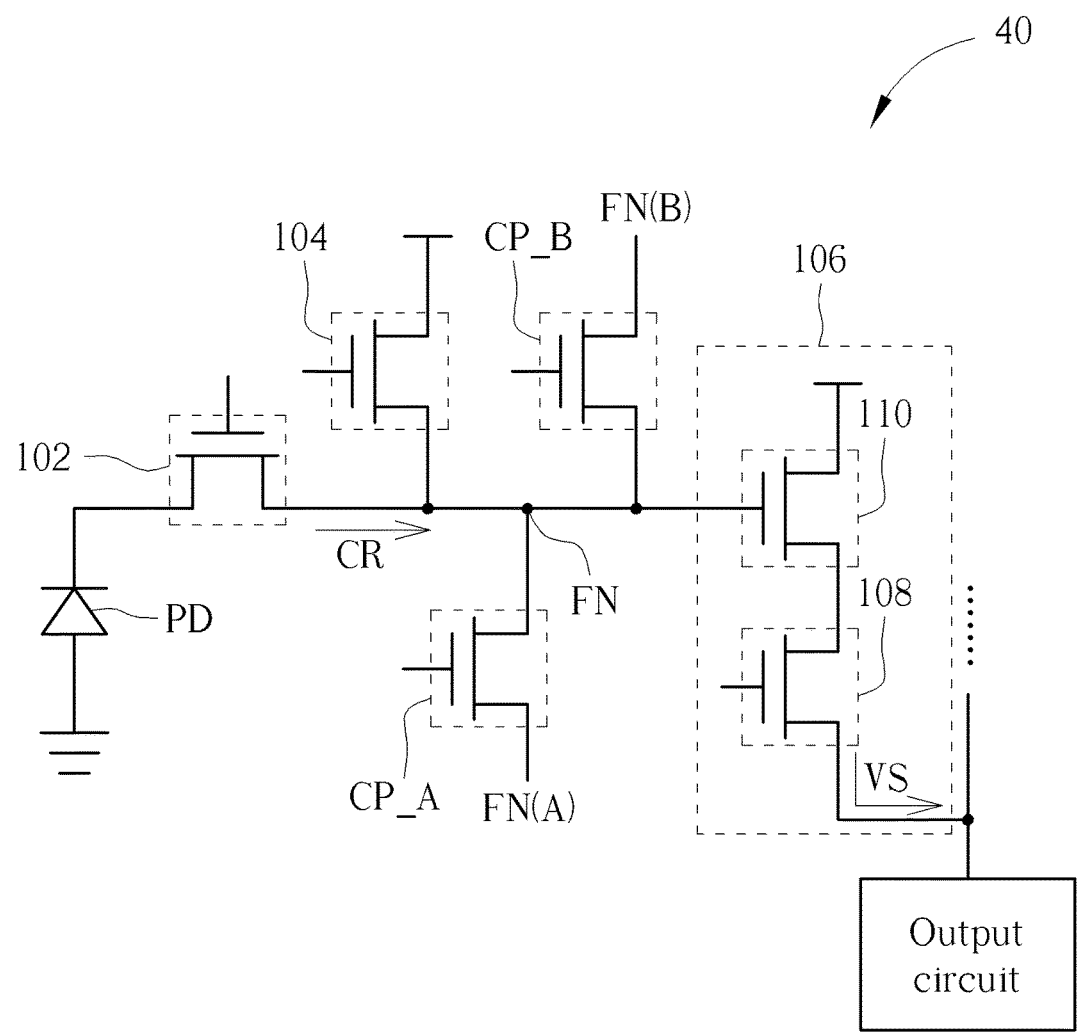
FIG. 4 is a schematic diagram of a light sensing circuit corresponding to a pixel in the image sensor according to an embodiment of the present invention.

Please refer to FIG. 4, which is a schematic diagram of a light sensing circuit 40 corresponding to a pixel in the image sensor according to an embodiment of the present invention. The structure of the light sensing circuit 40 is similar to the structure of the light sensing circuit shown in FIG. 1A; hence, signals or modules having the same functions are denoted by the same symbols. The main difference between the light sensing circuit 40 of the present invention and the light sensing circuit of FIG. 1A is that the light sensing circuit 40 further includes coupling elements CP_A and CP_B. The coupling elements CP_A and CP_B can couple the floating node FN of the light sensing circuit 40 to floating nodes (such as FN(A) and FN(B)) of other light sensing circuits in the image sensor, in order to transmit a part of the carriers CR stored in the floating node FN to the floating nodes FN(A) and FN(B), so that the capacitors on the floating nodes FN(A) and FN(B) can be used for storing the part of the carriers CR. In other words, in the image sensor, the capacitance value of the floating node of the light sensing circuit can be arbitrarily adjusted with the number of floating nodes from different pixels, to enhance carrier storage capability of each light sensing circuit, which further enhances the dynamic range and maximum SNR without increasing layout area and influencing light sensitivity.

In the light sensing circuit 40, the transfer of carriers or signals is controlled by each switch, i.e., the transfer switch 102, the reset switch 104, the select switch 108 and the coupling elements CP_A and CP_B. After the light sensing element PD performs light sensing and generates the carriers CR, the transfer switch 102 will be turned on to transfer the carriers CR in the light sensing element PD to the floating node FN. The coupling elements CP_A and CP_B are then turned on to allow a part of the carriers CR to be transmitted to the floating nodes FN(A) and FN(B) to be stored. When the output circuit needs to obtain the electronic signal VS of the light sensing circuit 40, the select switch 108 is turned on to allow the output circuit to read out the electronic signal VS. After the electronic signal VS is read out, the reset switch 104 will be turned on to eliminate the carriers in the light sensing element PD and the floating nodes FN, FN(A) and FN(B), and then the next phase of light sensing and signal read-out will be performed. In addition, the operations of eliminating the carriers in the floating nodes FN, FN(A) and FN(B) can also be performed before the carriers CR are transferred to the floating node FN; these are not limited herein.

More specifically, when the transfer switch 102 is turned on, the path between the light sensing element PD and the floating node FN is turned on, and the carriers CR are transferred to the floating node FN from the light sensing element PD. A control terminal selects whether to turn on the coupling elements CP_A and CP_B. When the coupling elements CP_A and CP_B are turned on, a part of the carriers CR are further transferred to the floating nodes FN(A) and FN(B) from the floating node FN. The output unit 106 then outputs the electronic signal VS according to the voltage level of the floating node FN when the select switch 108 is turned on. Under the structure of the output unit 106, the electronic signal VS is transmitted to the output circuit of the image sensor in a voltage signal form. The output element 110 may be an amplifier. The amplifier generates a voltage signal on its gate terminal according to the capacitance value of the floating node FN and the number of carriers stored in the floating node FN. The amplifier then couples the gate voltage signal to its source terminal. When the select switch 108 is turned on, the source voltage signal is then outputted as the electronic signal VS via the select switch 108. Before the electronic signal VS is read, the reset switch 104 is turned on to eliminate the carriers in the floating nodes FN, FN(A) and FN(B). In this case, a terminal of the reset switch 104 is coupled to the floating node FN, and the other terminal is coupled to a power terminal, where the carriers CR are electrons. When the reset switch 104 is turned on, the carriers CR in the floating nodes FN, FN(A) and FN(B) are transferred to the power terminal, so that the voltages of the floating nodes FN, FN(A) and FN(B) reach a power level (i.e., eliminating the carriers CR). In other embodiments, the carriers CR may be electrons, holes or any other carriers which can drift with varying circuit characteristics to generate signals.

Please note that, according to the structure of the light sensing circuit 40, the carriers CR can not only be stored in the capacitor of the floating node FN, but also stored in the capacitors of the floating nodes FN(A) and FN(B). In comparison with the prior art where carriers in each light sensing circuit of the image sensor can only be stored in the corresponding floating node (e.g., FN), in the present invention, carriers can be stored in more floating nodes (e.g., FN(A) and FN(B)) in addition to the floating node FN by using the coupling elements, which increases the carrier storage capability and further enhances the maximum SNR and dynamic range of the image sensor.

In addition, since the floating nodes FN(A) and FN(B) are floating nodes in other light sensing circuits of the image sensor instead of additionally included nodes, carrier storage capability increases without extra areas. This prevents the drawbacks in the prior art where additionally included capacitors reduce the exposure areas of the light sensing elements.

Please note that the user of the image sensor can simultaneously achieve high dynamic range and highlight sensitivity by controlling the coupling elements CP_A and CP_B to be turned on or off. That is, with different ambient light intensities, the user may select to operate the image sensor and the corresponding light sensing circuit 40 in a high dynamic range operation mode or a high sensitivity operation mode. For example, if the ambient light is more intensive, the user may select to operate the image sensor and the corresponding light sensing circuit 40 in the high dynamic range operation mode. Since the ambient light is more intensive, the light sensing element PD generates a larger number of carriers CR; hence, the user may select to turn on the coupling elements CP_A and CP_B, so that the floating node FN can be coupled to the floating nodes FN(A) and FN(B). This allows the capacitors in the floating node FN and the floating nodes FN(A), FN(B) to be used for storing the carriers CR. As a result, the floating nodes include larger capacitance to accommodate more carriers CR. On the other hand, if the ambient light is weaker, the user may select to operate the image sensor and the corresponding light sensing circuit 40 in the high sensitivity operation mode. Since the ambient light is weaker, the light sensing element PD generates a fewer number of carriers CR; hence, the user may select to turn off the coupling elements CP_A and CP_B, so that the carriers CR are stored in the floating node FN only. As a result, the capacitance used for storing the carriers CR will be smaller, so that only a few carriers CR are able to generate an evident electronic signal VS on the floating node FN, which increases sensitivity of photovoltaic conversion without amplifications in the back-end circuits. This prevents the drawbacks of reduced SNR when the back-end circuits perform amplifications on the electronic signal VS.

In an embodiment, the user may respectively determine the light sensing circuit corresponding to each pixel to be operated in the high dynamic range operation mode or the high sensitivity operation mode according to the light sensing result of each light sensing circuit; that is, the image sensor simultaneously realizes high dynamic range and high light sensitivity according to light sensing requirements. For example, the user may configure a threshold value corresponding to the number of carriers. When the number of carriers generated in light sensing performed by a light sensing element is greater than the threshold value, the light sensing circuit corresponding to the light sensing element is operated in the high dynamic range operation mode, and corresponding coupling elements are turned on. On the other hand, when the number of carriers generated in light sensing performed by a light sensing element is less than the threshold value, the light sensing circuit corresponding to the light sensing element is operated in the high sensitivity operation mode, and corresponding coupling elements are turned off. For example, the control circuit of the coupling elements determines whether the high dynamic range operation mode or the high sensitivity operation mode is used according to the previous readout; that is, the control circuit determines whether to turn on the corresponding coupling elements.

Figure 5:
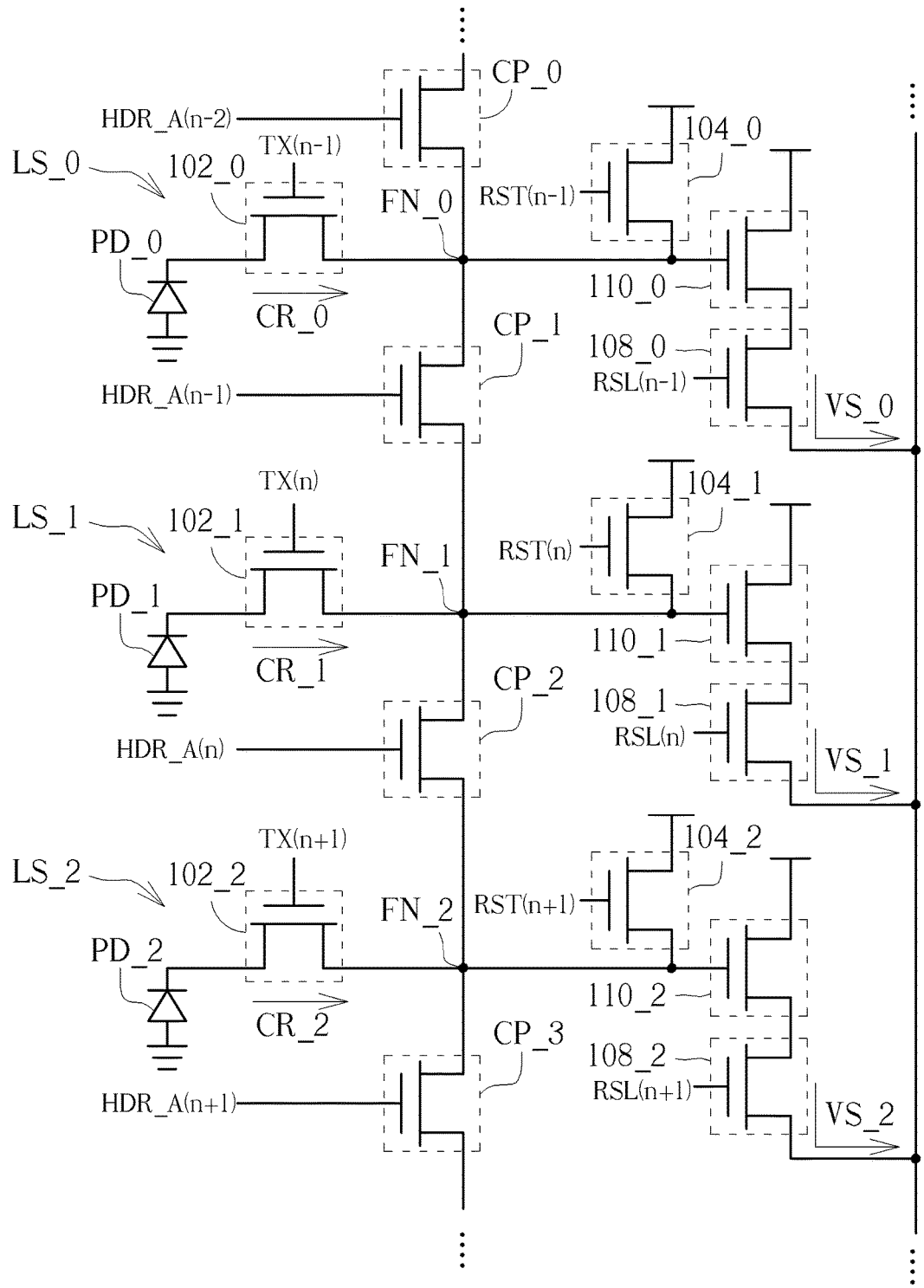
FIG. 5 illustrates the circuit structure with floating node sharing between different light sensing circuits via coupling elements.

Please refer to FIG. 5, which illustrates the circuit structure with floating node sharing between different light sensing circuits via coupling elements in detail. Please note that FIG. 5 only illustrates three light sensing circuits LS_0, LS_1 and LS_2 in the same column for simplicity. Practically, pixels are arranged in an array in the image sensor; hence, the corresponding light sensing circuits are also arranged in an array, and the number of arranged light sensing circuits may be far greater than those shown in FIG. 5, such as three millions, five millions or several tens of millions. Take the light sensing circuit LS_1 as an example. If the light sensing result of the light sensing circuit LS_1 needs to be obtained, the coupling elements CP_1 and CP_2 may be turned on before the transfer switch 102_1 is turned on, so that the carriers CR_1 of the light sensing element PD_1 are stored in the capacitors of the floating nodes FN_0, FN_1 and FN_2 simultaneously. In a general operation, the floating node FN_0 corresponding to the light sensing element PD_0 is used for receiving and storing the carriers CR_0 of the light sensing element PD_0, and the floating node FN_2 corresponding to the light sensing element PD_2 is used for receiving and storing the carriers CR_2 of the light sensing element PD_2. When the output circuit reads out the light sensing result of the light sensing circuit LS_1, the floating nodes FN_0 and FN_2 can support the light sensing circuit LS_1, in order to increase storage capability of the carriers CR_1. In FIG. 5, each coupling element is connected between the floating nodes located in two adjacent rows of light sensing circuits, but in other embodiments, a coupling element may connect floating nodes of light sensing circuits located in two non-adjacent rows, which is not limited herein.

Please note that for simplicity, each of the transfer switches, reset switches, select switches and coupling elements shown in FIG. 4 and FIG. 5 is denoted by a single transistor, but in the embodiments of the present invention, any switch or coupling element may be composed of a single transistor or multiple transistors, which is not limited herein. The implementations of a single transistor may include an NMOS, a P-type metal oxide semiconductor field effect transistor (PMOS) or other type of transistor, and the implementations of multiple transistors may include a transmission gate.

FIGS. 6 to 10 illustrate signal waveforms to describe detailed operations of the light sensing circuits LS_0, LS_1 and LS_2 based on the circuit structure shown in FIG. 5. The illustrated waveforms include transfer control signals TX(n−1), TX(n) and TX(n+1) for controlling the transfer switches 102_0, 102_1 and 102_2 respectively, reset signals RST(n−1), RST(n) and RST(n+1) for controlling the reset switches 104_0, 104_1 and 104_2 respectively, select signals RSL(n−1), RSL(n) and RSL(n+1) for controlling the select switches 108_0, 108_1 and 108_2 respectively, and coupling control signals HDR_A(n−2), HDR_A(n−1), HDR_A(n) and HDR_A(n+1) for controlling the coupling elements CP_0, CP_1, CP_2 and CP_3 respectively. The coupling element CP_1 is coupled between the floating nodes FN_0 and FN_1, the coupling element CP_2 is coupled between the floating nodes FN_1 and FN_2, the coupling element CP_3 is coupled between the floating node FN_2 and another floating node (not illustrated), and the floating node FN_0 is also coupled to another floating node (not illustrated) via the coupling element CP_0. Please note that, each of the abovementioned switches and coupling elements is implemented with an NMOS; hence, the control signals may turn off the switches or coupling elements with a low voltage level and turn on the switches or coupling elements with a high voltage level.

Figure 6:
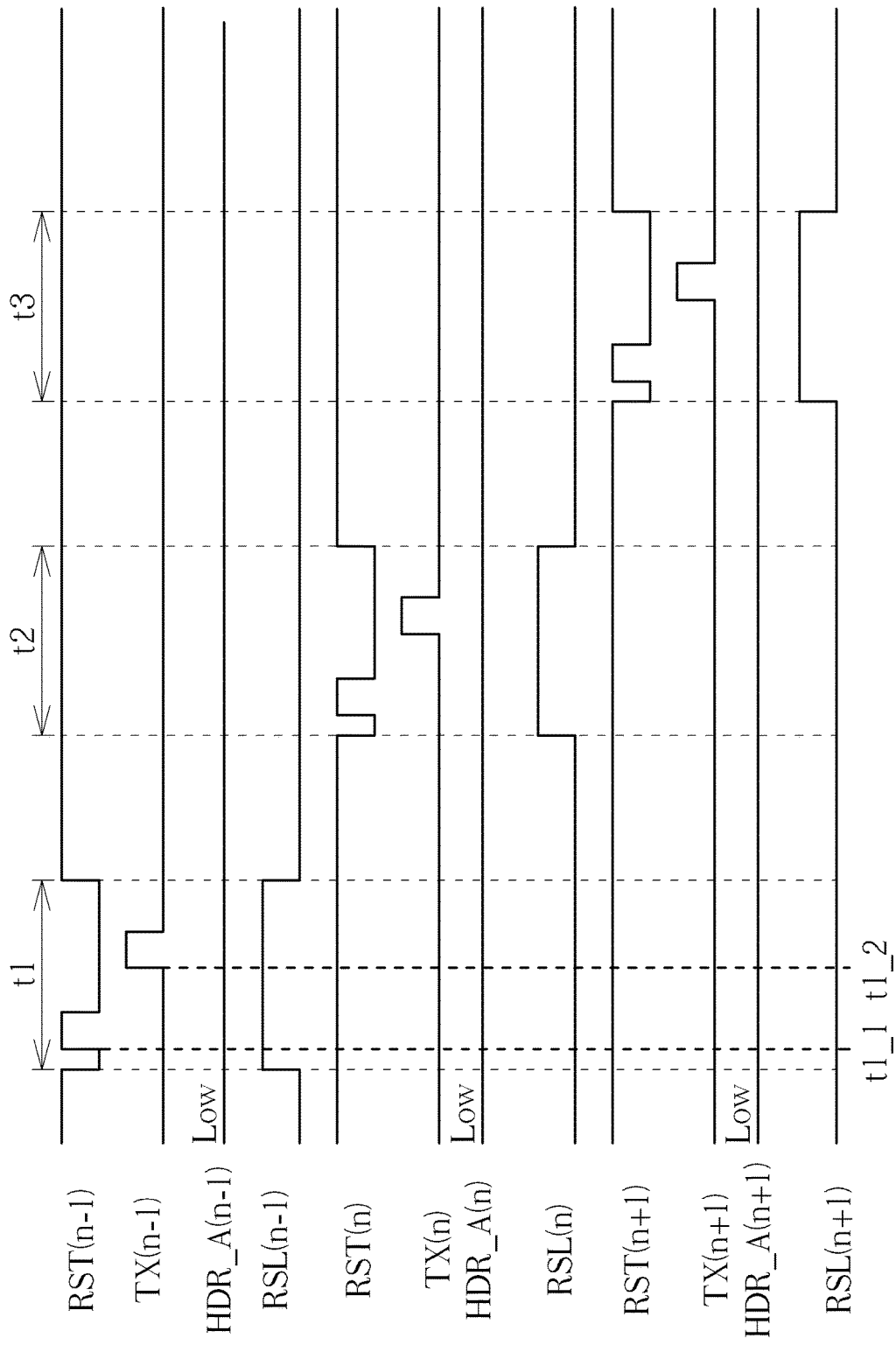
FIGS. 6-10 are waveform diagrams illustrating operations of the light sensing circuit according to an embodiment of the present invention.

Please refer to FIG. 6, which is a waveform diagram illustrating operations of the light sensing circuit according to an embodiment of the present invention. As shown in FIG. 6, the light sensing circuits LS_0, LS_1 and LS_2 are in a normal operation mode; that is, each of the light sensing circuits LS_0, LS_1 and LS_2 only applies the capacitor in its corresponding floating node FN_0, FN_1 or FN_2 to store carriers. In detail, the output circuit in turn obtains the electronic signals VS_0, VS_1 and VS_2 from the light sensing circuits LS_0, LS_1 and LS_2 during the periods t1, t2 and t3, respectively; hence, the select signals RSL(n−1), RSL(n) and RSL(n+1) control the select switches 108_0, 108_1 and 108_2 to be turned on during the periods t1, t2 and t3, respectively, and turned off in other time. Since each of the light sensing circuits LS_0, LS_1 and LS_2 only applies its floating node FN_0, FN_1 or FN_2 to store the carriers, the coupling control signals HDR_A(n−2), HDR_A(n−1), HDR_A(n) and HDR_A(n+1) all keep in low voltage to control the coupling elements CP_0, CP_1, CP_2 and CP_3 to be turned off. During the period t1, the select signal RSL(n−1) turns on the select switch 108_0 to obtain the light sensing result of the light sensing circuit LS_0, i.e., the electronic signal VS_0. In advance, the reset signal RST(n−1) may turn on the reset switch 104_0 for a period of time (at time t1_1) to eliminate the carriers in the floating node FN_0. After the reset switch 104_0 is turned off, the transfer control signal TX(n−1) may turn on the transfer switch 102_0 (at time t1_2) to transmit the carriers CR_0 to the floating node FN_0 to be stored. At this moment, since the select switch 108_0 has been turned on, the output circuit of the image sensor obtains the electronic signal VS_0 corresponding to the gate voltage of the output element 110_0 according to the number of carriers CR_0 and the capacitance value in the floating node FN_0. In this case, all of the coupling elements CP_0, CP_1, CP_2 and CP_3 are turned off, so that each light sensing circuit only uses the capacitor in its corresponding floating node to store the carriers. In such a situation, since the capacitance for storing the carriers is smaller, the image sensor possesses fine photovoltaic conversion sensitivity and is thereby adaptive to the conditions where ambient light is weaker. Further, in FIG. 6, the output circuit of the image sensor obtains the electronic signals VS_1 and VS_2 by the same method during the periods t2 and t3, respectively. According to the above illustrations, those skilled in the art are able to obtain the operations of the image sensor during the periods t2 and t3, which will not be narrated herein.

Figure 7:
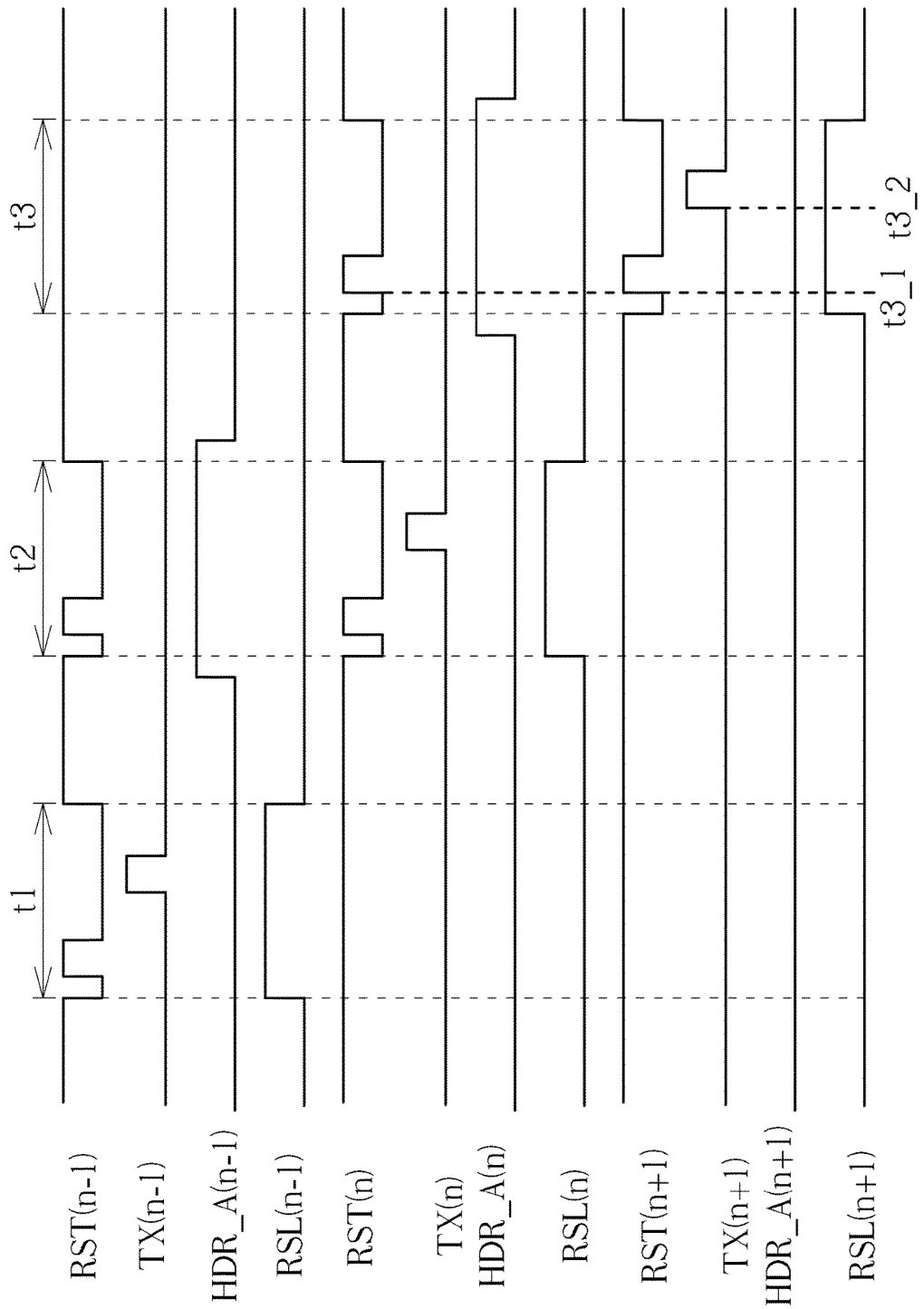

Please refer to FIG. 7, which is a waveform diagram illustrating operations of the light sensing circuit according to another embodiment of the present invention. As shown in FIG. 7, each of the light sensing circuits LS_0, LS_1 and LS_2 applies capacitors in two floating nodes to store carriers. In detail, the output circuit in turn obtains the electronic signals VS_0, VS_1 and VS_2 from the light sensing circuits LS_0, LS_1 and LS_2 during the periods t1, t2 and t3, respectively; hence, the select signals RSL(n−1), RSL(n) and RSL(n+1) control the select switches 108_0, 108_1 and 108_2 to be turned on during the periods t1, t2 and t3, respectively, and turned off in other time. Each of the light sensing circuits LS_0, LS_1 and LS_2 not only applies its floating node FN_0, FN_1 or FN_2 to store the carriers, but also applies the floating node in a light sensing circuit located in the previous read-out row. That is, the light sensing circuit LS_1 further applies the floating node FN_0 to store the carriers, and the light sensing circuit LS_2 further applies the floating node FN_1 to store the carriers. For example, during the period t3, the select signal RSL(n+1) turns on the select switch 108_2 to obtain the light sensing result of the light sensing circuit LS_2, i.e., the electronic signal VS_2, and the coupling control signal HDR_A(n) also turns on the coupling element CP_2 to couple the floating node FN_2 to the floating node FN_1. In advance, the reset signal RST(n+1) turns on the reset switch 104_2 for a period of time (at time t3_1) to eliminate the carriers in the floating node FN_2. Meanwhile, the reset signal RST (n) also turns on the reset switch 104_1 to eliminate the carriers in the floating node FN_1. After the reset switches 104_1 and 104_2 are turned off, the transfer control signal TX(n+1) turns on the transfer switch 102_2 (at time t3_2) to transmit the carriers CR_2 to the floating nodes FN_1 and FN_2 to be stored. At this moment, since the select switch 108_2 has been turned on, the output circuit of the image sensor obtains the electronic signal VS_2 corresponding to the gate voltage of the output element 110_2 according to the number of carriers CR_2 and the capacitance values in the floating nodes FN_1 and FN_2. In this case, the turned-on coupling element CP_2 allows the light sensing circuit LS_2 to use the capacitors in both of the floating nodes FN_1 and FN_2 to store the carriers. In such a situation, since the capacitance for storing the carriers is larger, the carrier storage capability of the light sensing circuit LS_2 is higher, so that the image sensor possesses a better dynamic range and is thereby adaptive to the conditions where the ambient light is more intensive. Further, in FIG. 7, the output circuit of the image sensor obtains the electronic signals VS_0 and VS_1 by the same method during the periods t1 and t2, respectively. According to the above illustrations, those skilled in the art are able to obtain the operations of the image sensor during the periods t1 and t2, which will not be narrated herein.

Figure 8:
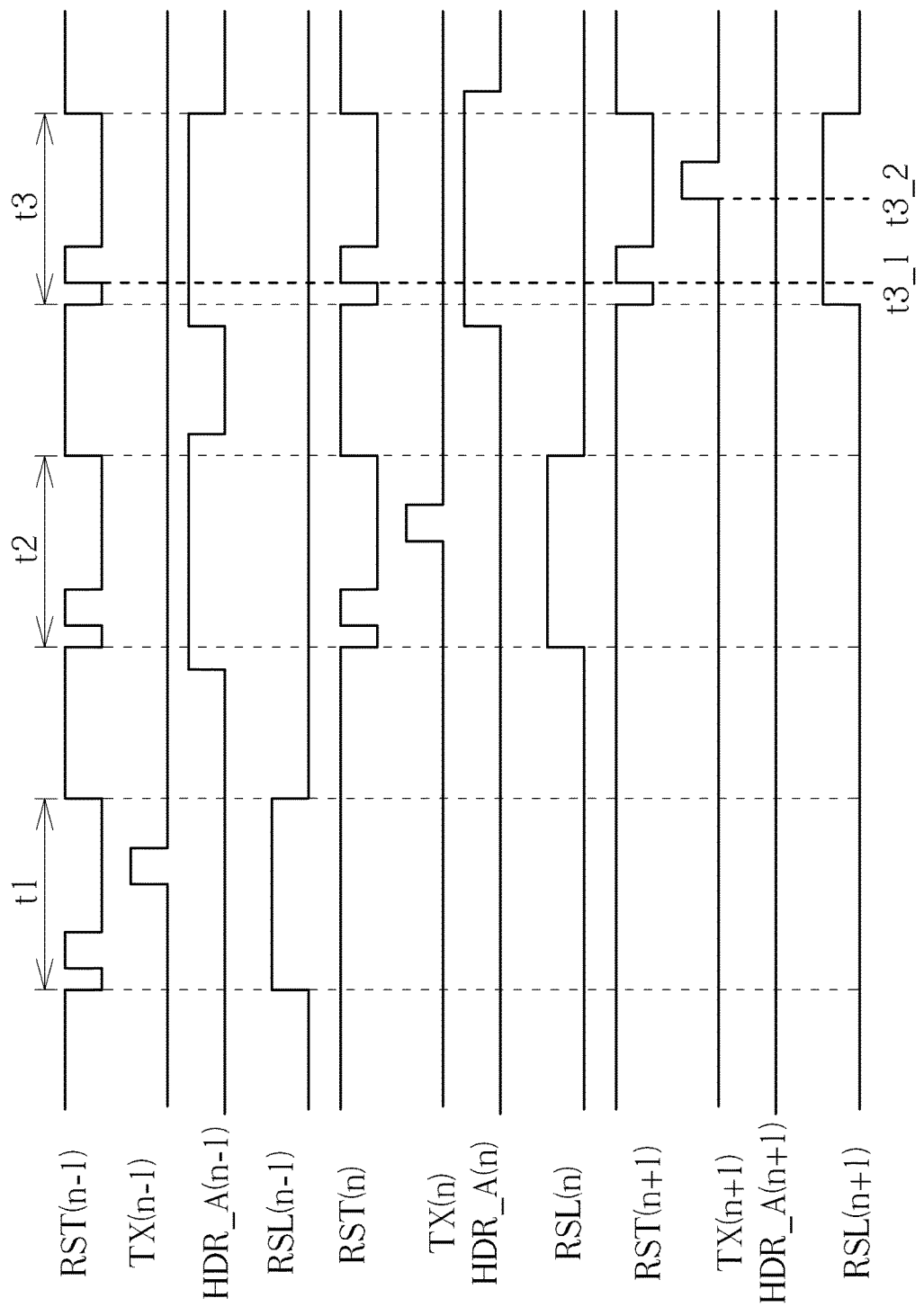

Please refer to FIG. 8, which is a waveform diagram illustrating operations of the light sensing circuit according to another embodiment of the present invention. As shown in FIG. 8, each of the light sensing circuits LS_0, LS_1 and LS_2 applies capacitors in three floating nodes to store carriers. In detail, the output circuit in turn obtains the electronic signals VS_0, VS_1 and VS_2 from the light sensing circuits LS_0, LS_1 and LS_2 during the periods t1, t2 and t3, respectively; hence, the select signals RSL(n−1), RSL(n) and RSL(n+1) control the select switches 108_0, 108_1 and 108_2 to be turned on during the periods t1, t2 and t3, respectively, and turned off in other time. Each of the light sensing circuits LS_0, LS_1 and LS_2 not only applies its floating node FN_0, FN_1 or FN_2 to store the carriers, but also applies the floating nodes in light sensing circuits located in the previous two read-out rows. That is, the light sensing circuit LS_2 further applies the floating nodes FN_0 and FN_1 to store the carriers. For example, during the period t3, the select signal RSL(n+1) turns on the select switch 108_2 to obtain the light sensing result of the light sensing circuit LS_2, i.e., the electronic signal VS_2, and the coupling control signals HDR_A(n−1) and HDR_A(n) also turn on the coupling elements CP_1 and CP_2 to couple the floating node FN_2 to the floating nodes FN_0 and FN_1. In advance, the reset signal RST(n+1) turns on the reset switch 104_2 for a period of time (at time t3_1) to eliminate the carriers in the floating node FN_2. Meanwhile, the reset signals RST(n−1) and RST (n) also turn on the reset switches 104_0 and 104_1, respectively, to eliminate the carriers in the floating nodes FN_0 and FN_1. After the reset switches 104_0, 104_1 and 104_2 are turned off, the transfer control signal TX(n+1) turns on the transfer switch 102_2 (at time t3_2) to transmit the carriers CR_2 to the floating nodes FN_0, FN_1 and FN_2 to be stored. At this moment, since the select switch 108_2 has been turned on, the output circuit of the image sensor obtains the electronic signal VS_2 corresponding to the gate voltage of the output element 110_2 according to the number of carriers CR_2 and the capacitance values in the floating nodes FN_0, FN_1 and FN_2. In this case, the coupling elements CP_1 and CP_2 are both turned on, allowing the light sensing circuit LS_2 to use the capacitors in all of the floating nodes FN_0, FN_1 and FN_2 to store the carriers. In such a situation, higher capacitance is used for storing the carriers, so that the dynamic range of the image sensor achieves further enhancements and the image sensor is thereby adaptive to the conditions where the ambient light is more and more intensive. Further, in FIG. 8, the output circuit of the image sensor obtains the electronic signals VS_0 and VS_1 by the same method during the periods t1 and t2, respectively. According to the above illustrations, those skilled in the art are able to obtain the operations of the image sensor during the periods t1 and t2, which will not be narrated herein.

Figure 9:
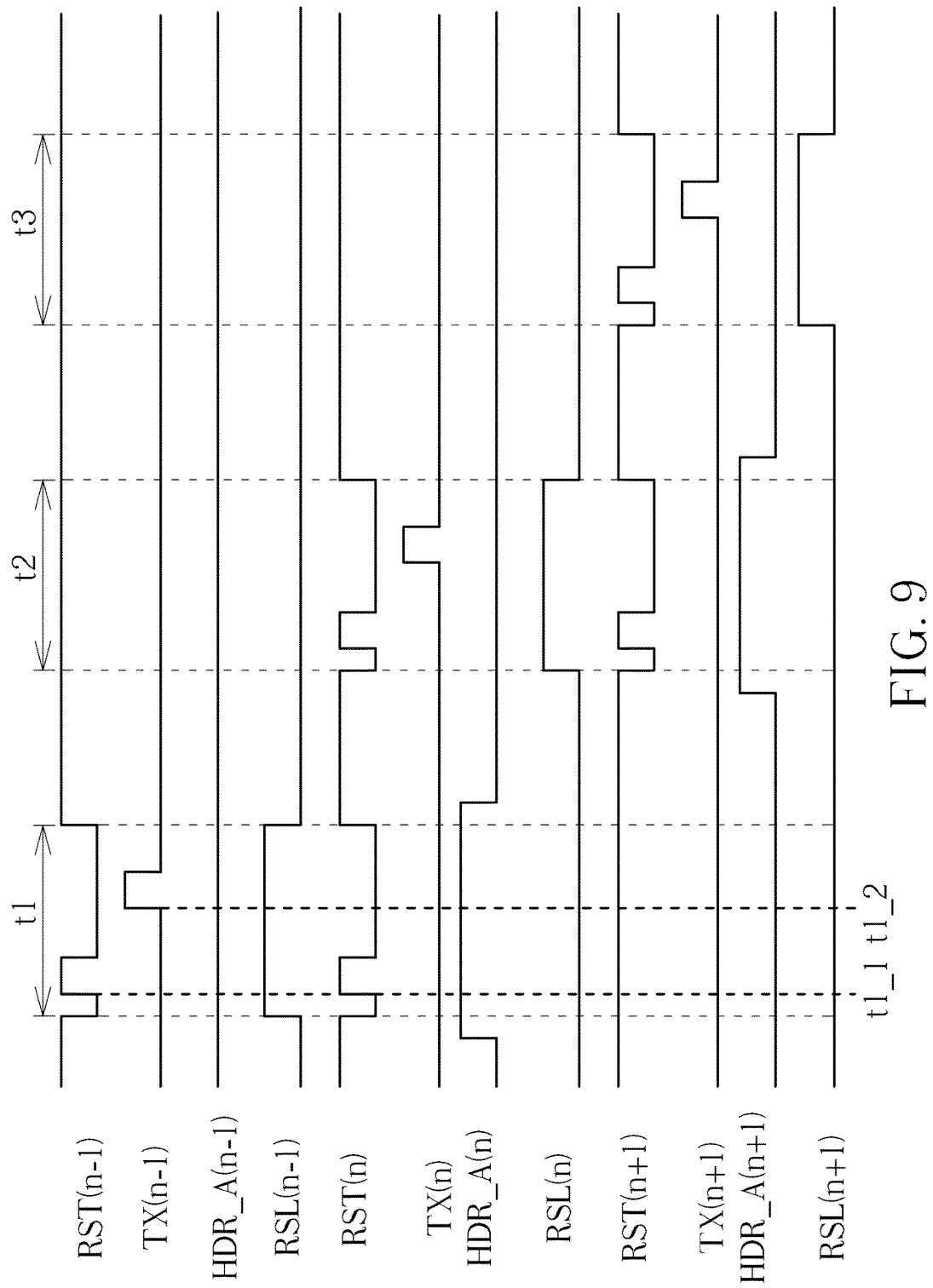

Please note that, in addition to storing carriers in the floating nodes located in light sensing circuits in previous read-out rows with previous read-out results, the light sensing circuit can also store carriers in the floating nodes located in light sensing circuits where the light sensing results will be read out later. For example, please refer to FIG. 9, which is a waveform diagram illustrating operations of the light sensing circuit according to another embodiment of the present invention. As shown in FIG. 9, each of the light sensing circuits LS_0, LS_1 and LS_2 applies capacitors in two floating nodes to store carriers. In detail, the output circuit in turn obtains the electronic signals VS_0, VS_1 and VS_2 from the light sensing circuits LS_0, LS_1 and LS_2 during the periods t1, t2 and t3, respectively; hence, the select signals RSL(n−1), RSL(n) and RSL(n+1) control the select switches 108_0, 108_1 and 108_2 to be turned on during the periods t1, t2 and t3, respectively, and turned off in other time. Each of the light sensing circuits LS_0, LS_1 and LS_2 not only applies its floating node FN_0, FN_1 or FN_2 to store the carriers, but also applies the floating node in a light sensing circuit located in the next row to be read out. That is, the light sensing circuit LS_0 further applies the floating node FN_1 to store the carriers, and the light sensing circuit LS_1 further applies the floating node FN_2 to store the carriers. For example, during the period t1, the select signal RSL(n−1) turns on the select switch 108_0 to obtain the light sensing result of the light sensing circuit LS_0, i.e., the electronic signal VS_0, and the coupling control signal HDR_A(n−1) also turns on the coupling element CP_1 to couple the floating node FN_0 to the floating node FN_1. In advance, the reset signal RST(n−1) turns on the reset switch 104_0 for a period of time (at time t1_1) to eliminate the carriers in the floating node FN_0. Meanwhile, the reset signal RST(n) also turns on the reset switch 104_1 to eliminate the carriers in the floating node FN_1. After the reset switches 104_0 and 104_1 are turned off, the transfer control signal TX(n−1) turns on the transfer switch 102_0 (at time t1_2) to transmit the carriers CR_0 to the floating nodes FN_0 and FN_1 to be stored. At this moment, since the select switch 108_0 has been turned on, the output circuit of the image sensor obtains the electronic signal VS_0 corresponding to the gate voltage of the output element 110_0 according to the number of carriers CR_0 and the capacitance values in the floating nodes FN_0 and FN_1. In this case, the turned-on coupling element CP_1 allows the light sensing circuit LS_0 to use the capacitors in both of the floating nodes FN_0 and FN_1 to store the carriers. In such a situation, since the capacitance for storing the carriers is larger, the carrier storage capability of the light sensing circuit LS_0 is higher, so that the image sensor possesses a better dynamic range and is thereby adaptive to the conditions where the ambient light is more intensive. Further, in FIG. 9, the output circuit of the image sensor obtains the electronic signals VS_1 and VS_2 by the same method during the periods t2 and t3, respectively. According to the above illustrations, those skilled in the art are able to obtain the operations of the image sensor during the periods t2 and t3, which will not be narrated herein.

Figure 10:
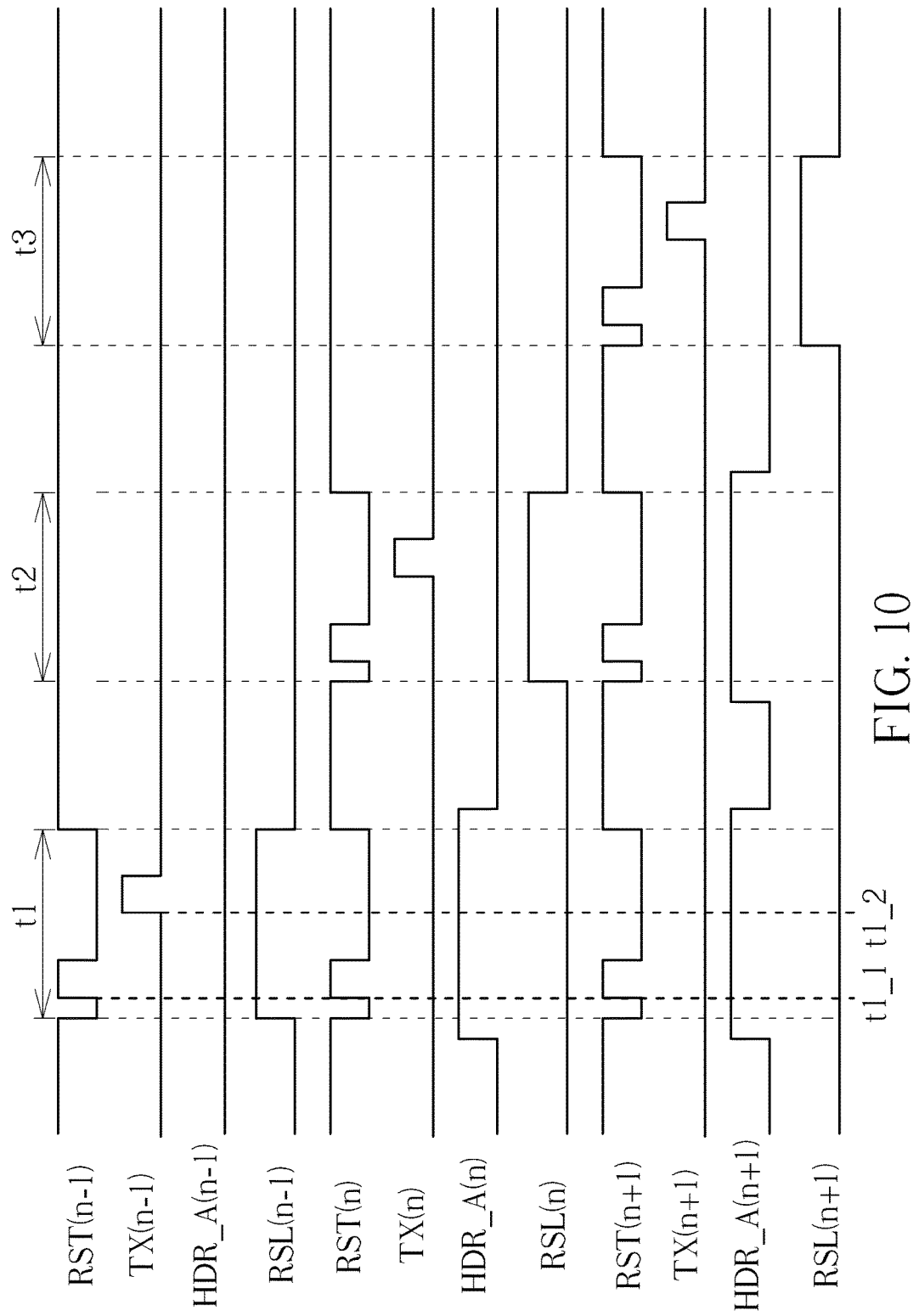

Please refer to FIG. 10, which is a waveform diagram illustrating operations of the light sensing circuit according to another embodiment of the present invention. As shown in FIG. 10, each of the light sensing circuits LS_0, LS_1 and LS_2 applies capacitors in three floating nodes to store carriers. In detail, the output circuit in turn obtains the electronic signals VS_0, VS_1 and VS_2 from the light sensing circuits LS_0, LS_1 and LS_2 during the periods t1, t2 and t3; hence, the select signals RSL(n−1), RSL(n) and RSL(n+1) control the select switches 108_0, 108_1 and 108_2 to be turned on during the periods t1, t2 and t3, respectively, and turned off in other time. Each of the light sensing circuits LS_0, LS_1 and LS_2 not only applies its floating node FN_0, FN_1 or FN_2 to store the carriers, but also applies the floating nodes in light sensing circuits located in the next two rows to be read out. That is, the light sensing circuit LS_0 further applies the floating nodes FN_1 and FN_2 to store the carriers. For example, during the period t1, the select signal RSL(n−1) turns on the select switch 108_0 to obtain the light sensing result of the light sensing circuit LS_0, i.e., the electronic signal VS_0, and the coupling control signals HDR_A(n−1) and HDR_A(n) also turn on the coupling elements CP_1 and CP_2 to couple the floating node FN_0 to the floating nodes FN_1 and FN_2. In advance, the reset signal RST(n−1) turns on the reset switch 104_0 for a period of time (at time t1_1) to eliminate the carriers in the floating node FN_0. Meanwhile, the reset signals RST(n) and RST(n+1) also turn on the reset switches 104_1 and 104_2, respectively, to eliminate the carriers in the floating nodes FN_1 and FN_2. After the reset switches 104_0, 104_1 and 104_2 are turned off, the transfer control signal TX (n−1) turns on the transfer switch 102_0 (at time t1_2) to transmit the carriers CR_0 to the floating nodes FN_0, FN_1 and FN_2 to be stored. At this moment, since the select switch 108_0 has been turned on, the output circuit of the image sensor obtains the electronic signal VS_0 corresponding to the gate voltage of the output element 110_0 according to the number of carriers CR_0 and the capacitance values in the floating nodes FN_0, FN_1 and FN_2. In this case, the coupling elements CP_1 and CP_2 are both turned on, allowing the light sensing circuit LS_0 to use the capacitors in all of the floating nodes FN_0, FN_1 and FN_2 to store the carriers. In such a situation, higher capacitance is used for storing the carriers, so that the dynamic range of the image sensor achieves further enhancements and the image sensor is thereby adaptive to the conditions where the ambient light is more and more intensive. Further, in FIG. 10, the output circuit of the image sensor obtains the electronic signals VS_1 and VS_2 by the same method during the periods t2 and t3, respectively. According to the above illustrations, those skilled in the art are able to obtain the operations of the image sensor during the periods t2 and t3, which will not be narrated herein.

Please note that, the present invention adjusts the number of floating nodes used for storing carriers by controlling the coupling elements to be turned on or off, in order to be adapted to different ambient light conditions. This further achieves high dynamic range, high light sensitivity and high SNR. Those skilled in the art can make modifications and alternations accordingly. For example, in the above embodiments, the floating nodes used for storing carriers may be those in the light sensing circuits previously read out or those in the light sensing circuits to be read out later. In other embodiments, the floating nodes used for storing carriers may include both of those in the light sensing circuits previously read out and those in the light sensing circuits to be read out later. For example, the light sensing circuit LS_1 may use the floating nodes FN_0 and FN_2 to store carriers. In addition, in several embodiments, one light sensing circuit may use capacitors in four, five or more floating nodes to store carriers, to further enhance the dynamic range of the image sensor. For an image sensor having N rows of pixels, the number of coupling elements simultaneously turned on may achieve N−1 in maximum, so that the carrier storage capability may increase by N times, which achieves more enhancements in the dynamic range and SNR. On the other hand, in the above embodiments illustrated in FIGS. 6 to 10, the carriers in the floating nodes are eliminated before the output circuit of the image sensor reads out the light sensing result, but in other embodiments, the reset switch may be turned on to eliminate the carriers in the floating nodes immediately after the output circuit reads out the light sensing result. Please note that, when the coupling elements are turned on to connect the floating nodes, the carriers in the interconnected floating nodes are eliminated if any one of the reset switches corresponding to these floating nodes is turned on. Alternatively, as shown in the above embodiments, the reset switches corresponding to every floating node may be turned on to eliminate the carriers in every floating node, respectively.

Figure 11A:
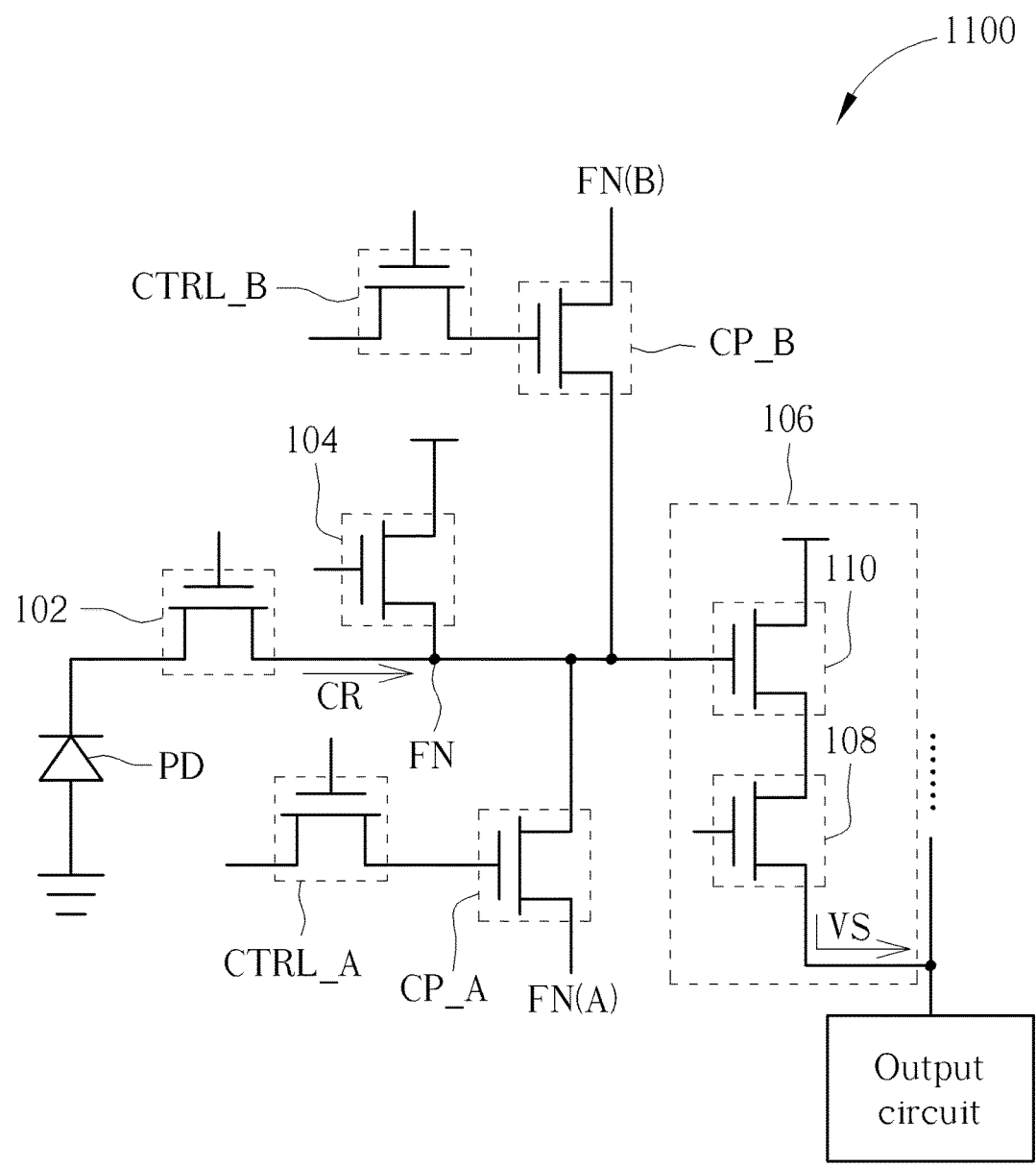
FIG. 11A and FIG. 11B are schematic diagrams of a light sensing circuit of another image sensor according to an embodiment of the present invention.
Figure 11B:
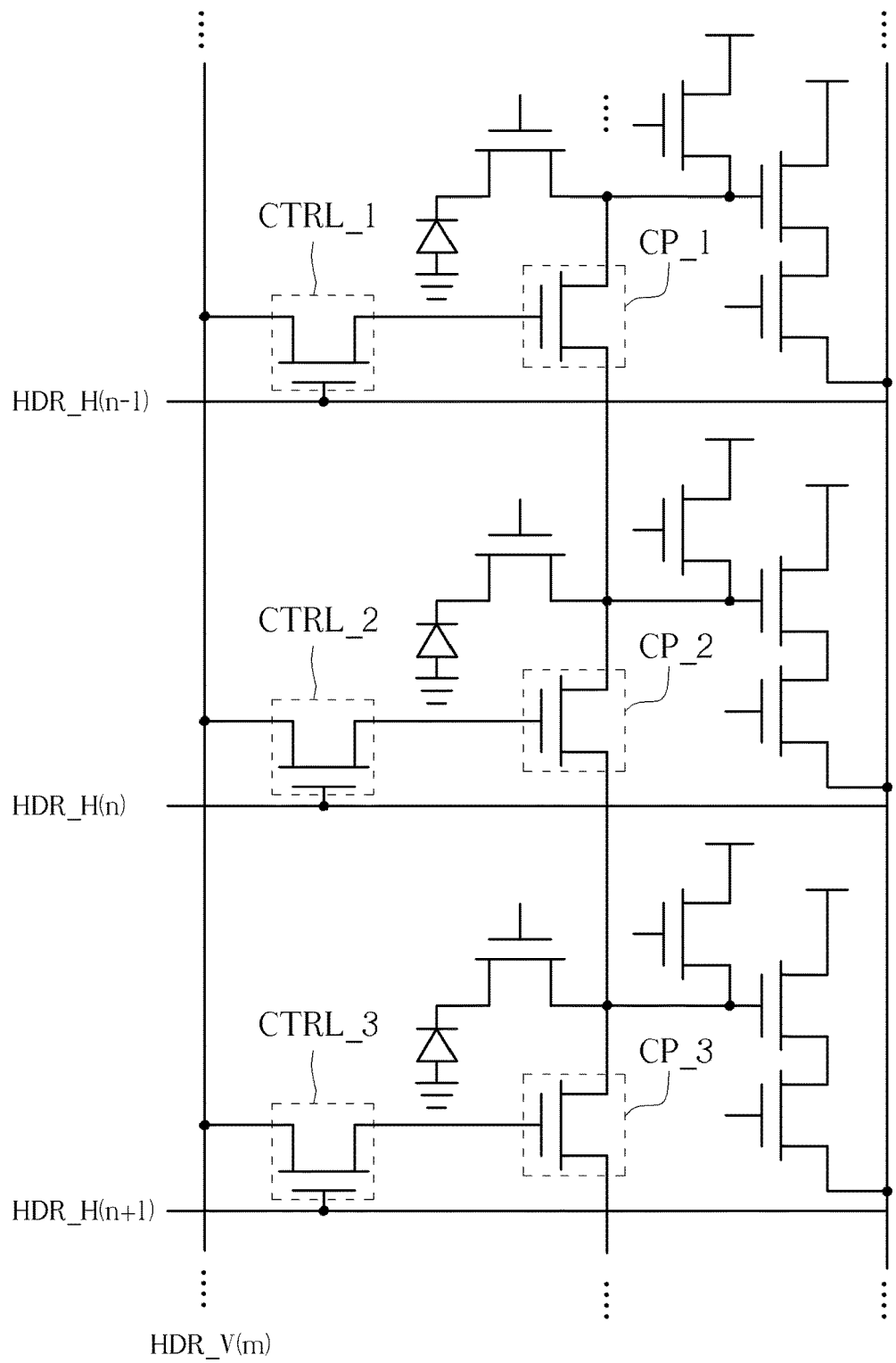

In an embodiment, the high sensitivity operation mode and high dynamic range operation mode can be simultaneously realized in one frame. For example, additional control circuits may be added to the light sensing circuits to control each light sensing circuit to be operated in the high sensitivity operation mode or high dynamic range operation mode when the output circuit reads out the light sensing results. Please refer to FIG. 11A and FIG. 11B, which are schematic diagrams of a light sensing circuit of another image sensor according to an embodiment of the present invention, wherein FIG. 11A illustrates the structure of a light sensing circuit 1100 corresponding to a single pixel, and FIG. 11B illustrates the structure of multiple light sensing circuits arranged in the image sensor. As shown in FIG. 11A, the structure of the light sensing circuit 1100 is similar to the structure of the light sensing circuit 40 shown in FIG. 4A; hence, signals or modules having the same functions are denoted by the same symbols. The main difference between the light sensing circuit 1100 and the light sensing circuit 40 is that the coupling elements CP_A and CP_B of the light sensing circuit 1100 are controlled by control elements CTRL_A and CTRL_B, respectively. In detail, in FIG. 11A, the coupling elements CP_A, CP_B and the control elements CTRL_A, CTRL_B are all implemented with a transistor, wherein the control element CTRL_A is coupled to the gate terminal of the coupling element CP_A for controlling the coupling element CP_A to be turned on or off, and the control element CTRL_B is coupled to the gate terminal of the coupling element CP_B for controlling the coupling element CP_B to be turned on or off.

FIG. 11B further illustrates the detailed control method. The image sensor controls the control elements by using horizontal control signals and vertical control signals, in order to control the coupling elements to be turned on or off. For example, the coupling element CP_1 is turned on when a horizontal control signal HDR_H(n−1) and a vertical control signal HDR_V(m) are turned on simultaneously, the coupling element CP_2 is turned on when a horizontal control signal HDR_H(n) and a vertical control signal HDR_V(m) are turned on simultaneously, and the coupling element CP_3 is turned on when a horizontal control signal HDR_H(n+1) and a vertical control signal HDR_V(m) are turned on simultaneously. In such a situation, each horizontal control signal HDR_H corresponds to a row of coupling elements, and each vertical control signal HDR_V corresponds to a column of coupling elements. The image sensor turns on corresponding coupling elements by controlling the horizontal control signal HDR_H and the vertical control signal HDR_V when reading out the light sensing result in each row of pixels.

Figure 12:
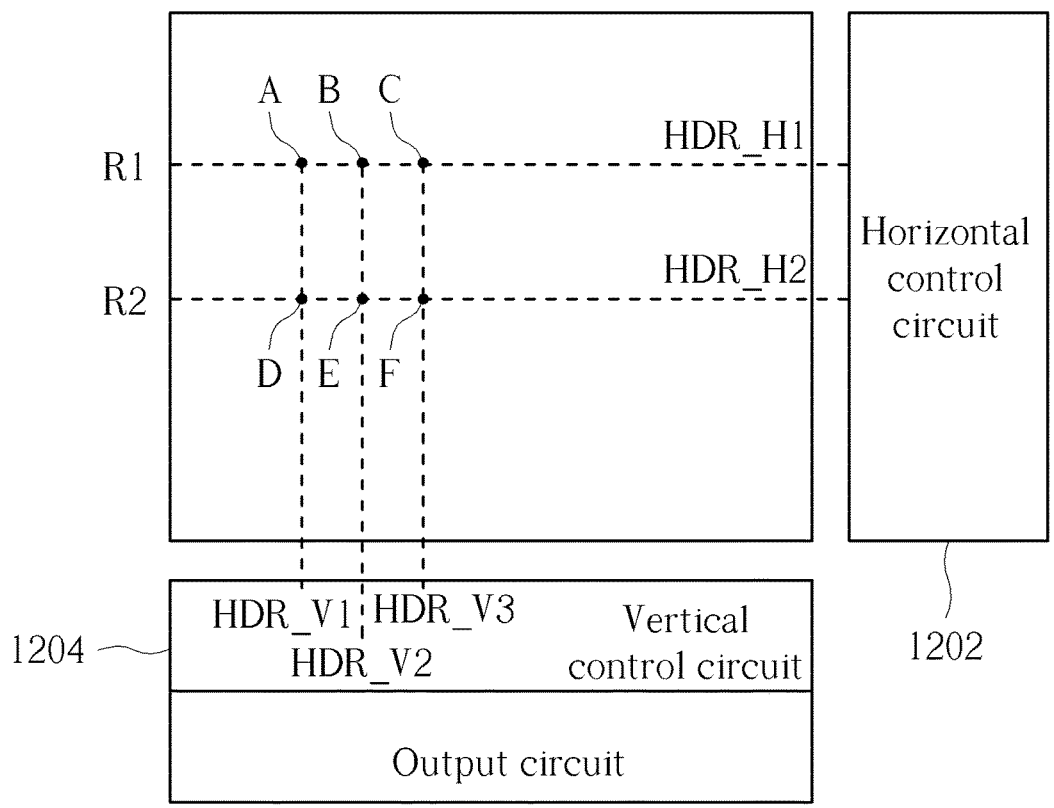
FIG. 12 is a schematic diagram of a pixel array of an image sensor where coupling elements are turned on or off by using the horizontal control signals and the vertical control signals according to an embodiment of the present invention.

For example, please refer to FIG. 12, which is a schematic diagram of a pixel array of an image sensor where coupling elements are turned on or off by using the horizontal control signals and the vertical control signals according to an embodiment of the present invention. As shown in FIG. 12, the image sensor includes a horizontal control circuit 1202 and a vertical control circuit 1204, which control the control elements by using the horizontal control signals and vertical control signals, respectively, in order to control the coupling elements to be turned on or off. When the output circuit of the image sensor needs to read out the light sensing result of a pixel in row R1, a horizontal control signal HDR_H1 is turned on, and vertical control signals HDR_V1, HDR_V2 and HDR_V3 control the coupling elements corresponding to light sensing circuits A, B and C, respectively. For example, if a user needs to control the light sensing circuits A and C to be operated in the high dynamic range operation mode and control the light sensing circuit B to be operated in the high sensitivity operation mode, the user turns on the horizontal control signal HDR_H1, and turns on the coupling elements corresponding to the light sensing circuits A and C via the vertical control signals HDR_V1 and HDR_V3, respectively, and turns off the coupling element corresponding to the light sensing circuit B via the vertical control signal HDR_V2. When the output circuit of the image sensor needs to read out the light sensing result of a pixel in row R2, a horizontal control signal HDR_H2 is turned on, and vertical control signals HDR_V1, HDR_V2 and HDR_V3 control the coupling elements corresponding to light sensing circuits D, E and F, respectively. For example, if a user needs to control the light sensing circuit E to be operated in the high dynamic range operation mode and control the light sensing circuits D and F to be operated in the high sensitivity operation mode, the user turns on the horizontal control signal HDR_H2, and turns on the coupling element corresponding to the light sensing circuit E via the vertical control signal HDR_V2 and turns off the coupling elements corresponding to the light sensing circuits D and F via the vertical control signals HDR_V1 and HDR_V3, respectively. As a result, the high sensitivity operation mode and the high dynamic range operation mode are realized in a frame of the image sensor simultaneously according to user requirements. For example, the user can apply high sensitivity operation mode (i.e., corresponding coupling elements are turned off when sensing light) in partial areas of a frame and apply high dynamic range operation mode (i.e., corresponding coupling elements are turned on when sensing light) in other areas according to the content in the previous frame. In addition, the user may adjust the number of turned-on coupling elements, to achieve an optimal balance between the dynamic range and light sensitivity.

To sum up, the present invention provides a light sensing unit and related light sensing circuit for an image sensor, which allow the image sensor to possess high dynamic range, high light sensitivity and high SNR. Each floating node can be coupled to other floating nodes via coupling elements, so that multiple floating nodes are used together for storing carriers generated by a light sensing element, to enhance carrier storage capability of the light sensing circuit. In the embodiments of the present invention, the capacitors in the floating nodes of other light sensing circuits can be applied to assist in carrier storage without adding additional capacitors. In addition, the coupling elements corresponding to each light sensing circuit can be controlled to be turned on or off via control circuits in horizontal/vertical direction, in order to realize the high sensitivity operation mode and high dynamic range operation mode simultaneously in one frame of the image sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A light sensing unit for a light sensing circuit of an image sensor, the light sensing unit comprising:

a first light sensing element, for sensing light to obtain a light sensing result and generating a plurality of carriers accordingly;

a first floating node, for receiving and storing the plurality of carriers generated by the first light sensing element;

a plurality of coupling elements, for coupling the first floating node to a plurality of second floating nodes, and transmitting a part of the plurality of carriers stored in the first floating node to the second floating nodes to be stored in the second floating nodes; and a plurality of control elements, each corresponding to one of the coupling elements;

wherein the control elements are controlled by a plurality of horizontal control signals and a plurality of vertical control signals, each of the control elements is controlled by one of the horizontal control signals and one of the vertical control signals, each of the horizontal control signals controls a row of coupling elements of the image sensor, and each of the vertical control signals controls a column of coupling elements of the image sensor;

wherein the plurality of horizontal control signals and the plurality of vertical control signals control at least two of the control elements to turn on the corresponding coupling elements simultaneously, to operate a part of the light sensing circuit in a high dynamic range operation mode.

2. The light sensing unit of claim 1, wherein each of the second floating nodes corresponds to one of a plurality of second light sensing elements in the image sensor, so that each of the second floating nodes receives and stores carriers generated by the corresponding second light sensing element.

3. The light sensing unit of claim 1, wherein the light sensing circuit further comprises an output unit, for outputting the light sensing result of the first light sensing element, wherein the output unit converts the plurality of carriers stored in the first floating node and the second floating nodes into an electronic signal and transmits the electronic signal to an output circuit, allowing the output circuit to read out the light sensing result from the electronic signal.

4. The light sensing unit of claim 3, wherein the electronic signal is a voltage signal.

5. The light sensing unit of claim 1, wherein the first floating node comprises a first capacitor and each of the second floating nodes comprises a second capacitor, wherein the first capacitor and the second capacitor are used for storing the plurality of carriers.

6. The light sensing unit of claim 1, wherein the coupling elements are turned on to couple the first floating node to the second floating nodes when the image sensor is in the high dynamic range operation mode, in order to allow the first floating node and the second floating nodes to store the plurality of carriers.

7. The light sensing unit of claim 6, wherein a number of the plurality of carriers generated by the first light sensing element is greater than a threshold value in the high dynamic range operation mode.

8. The light sensing unit of claim 1, wherein the coupling elements are turned off when the image sensor is in a high sensitivity operation mode, so that the plurality of carriers are stored in the first floating node only.

9. The light sensing unit of claim 8, wherein a number of the plurality of carriers generated by the first light sensing element is less than a threshold value in the high sensitivity operation mode.

10. A light sensing circuit for an image sensor, the light sensing circuit comprising:

a first light sensing element, for sensing light to obtain a light sensing result and generating a plurality of carriers accordingly;

a first floating node, for receiving and storing the plurality of carriers generated by the first light sensing element;

a transfer switch, coupled between the first light sensing element and the first floating node, for transmitting the plurality of carriers generated by the first light sensing element to the first floating node when turned on;

a plurality of coupling elements, for coupling the first floating node to a plurality of second floating nodes, and transmitting a part of the plurality of carriers stored in the first floating node to the second floating nodes to be stored in the second floating nodes;

a reset switch, coupled to the first floating node, for eliminating the plurality of carriers in the first floating node and the second floating nodes when turned on;

an output unit, comprising:
a select switch, controlled by an output circuit of the image sensor, for selecting to receive the light sensing result when turned on; and
an output element, for converting the plurality of carriers stored in the first floating node and the second floating nodes into an electronic signal, and transmitting the electronic signal to the output circuit when the select switch is turned on, allowing the output circuit to read out the light sensing result from the electronic signal; and a plurality of control elements, each corresponding to one of the coupling elements;

wherein the control elements are controlled by a plurality of horizontal control signals and a plurality of vertical control signals, each of the control elements is controlled by one of the horizontal control signals and one of the vertical control signals, each of the horizontal control signals controls a row of coupling elements of the image sensor, and each of the vertical control signals controls a column of coupling elements of the image sensor;

wherein the plurality of horizontal control signals and the plurality of vertical control signals control at least two of the control elements to turn on the corresponding coupling elements simultaneously, to operate a part of the light sensing circuit in a high dynamic range operation mode.

11. The light sensing circuit of claim 10, wherein the electronic signal is a voltage signal.

12. The light sensing circuit of claim 10, wherein each of the second floating nodes corresponds to one of a plurality of second light sensing elements in the image sensor, so that each of the second floating nodes receives and stores carriers generated by the corresponding second light sensing element.

13. The light sensing circuit of claim 10, wherein the first floating node comprises a first capacitor and each of the second floating nodes comprises a second capacitor, wherein the first capacitor and the second capacitor are used for storing the plurality of carriers.

14. The light sensing circuit of claim 10, wherein the coupling elements are turned on to couple the first floating node to the second floating nodes when the image sensor is in the high dynamic range operation mode, in order to allow the first floating node and the second floating nodes to store the plurality of carriers.

15. The light sensing circuit of claim 14, wherein a number of the plurality of carriers generated by the first light sensing element is greater than a threshold value in the high dynamic range operation mode.

16. The light sensing circuit of claim 10, wherein the coupling elements are turned off when the image sensor is in a high sensitivity operation mode, so that the plurality of carriers are stored in the first floating node only.

17. The light sensing circuit of claim 16, wherein a number of the plurality of carriers generated by the first light sensing element is less than a threshold value in the high sensitivity operation mode.

18. The light sensing circuit of claim 10, wherein during a first period, the transfer switch is turned off, and the coupling elements and the reset switch are turned on, to eliminate the plurality of carriers in the first floating node and the second floating nodes.

19. The light sensing circuit of claim 10, wherein during a second period, the reset switch is turned off, and the coupling elements and the transfer switch are turned on, to transmit the plurality of carriers to the first floating node and the second floating nodes to be stored.

20. The light sensing circuit of claim 19, wherein the select switch is turned on during the second period or a third period, allowing the output element to convert the plurality of carriers stored in the first floating node and the second floating nodes into the electronic signal, in order to allow the output circuit to read out the light sensing result from the electronic signal.

21. The light sensing circuit of claim 20, wherein the reset switch is turned on and the transfer switch is turned off to eliminate the plurality of carriers in the first floating node after the output circuit reads out the light sensing result, allowing the first floating node to receive and store carriers generated by a second light sensing element in the image sensor.

22. An image sensor, comprising:
a plurality of light sensing units arranged in an array, each comprising:
  a light sensing element, for sensing light to obtain a light sensing result and generating a plurality of carriers accordingly;
  a floating node, for receiving and storing the plurality of carriers generated by the light sensing element;
a plurality of coupling elements, each for coupling the floating node of a first light sensing unit of the plurality of light sensing units to the floating node of a second light sensing unit of the plurality of light sensing units, and transmitting a part of the plurality of carriers stored in the floating node of the first light sensing unit to the floating node of the second light sensing unit; and
a plurality of control elements, each corresponding to one of the plurality of coupling elements;
wherein the control elements are controlled by a plurality of horizontal control signals and a plurality of vertical control signals, each of the control elements is controlled by one of the horizontal control signals and one of the vertical control signals, each of the horizontal control signals controls a row of coupling elements among the plurality of coupling elements, and each of the vertical control signals controls a column of coupling elements among the plurality of coupling elements;
wherein the plurality of horizontal control signals and the plurality of vertical control signals control at least two of the control elements to turn on the corresponding coupling elements simultaneously, to operate a part of the light sensing circuit in a high dynamic range operation mode.

* * * * *